United States Patent [19]

Kiriyama et al.

[11] Patent Number: 5,485,468
[45] Date of Patent: Jan. 16, 1996

[54] DATA OUTPUT ENCODER HAVING RESETTING MECHANISM

[75] Inventors: Tetsuro Kiriyama, Kawasaki; Mahito Unno, Nagoya, both of Japan

[73] Assignees: Mitutoyo Corporation; Mitsubishi Denki Kabushiki Kaisha, Japan

[21] Appl. No.: 943,548

[22] Filed: Sep. 11, 1992

[30] Foreign Application Priority Data

Sep. 17, 1991 [JP] Japan .................................. 3-265328

[51] Int. Cl.⁶ .......................... G06F 11/00; H03M 1/10; H03M 13/00; H03M 1/22
[52] U.S. Cl. ............................. 364/560; 341/13; 341/15
[58] Field of Search ...................... 371/29.1; 324/207.14, 324/207.24, 207.25, 457; 341/9, 13, 14, 15, 16; 33/706, 707; 250/237 G, 231.16

[56] References Cited

U.S. PATENT DOCUMENTS

| | | | |
|---|---|---|---|
| 4,449,191 | 5/1984 | Mehnert | 364/559 |
| 4,631,519 | 12/1986 | Johnston | 341/13 |
| 4,786,891 | 11/1988 | Ueda et al. | 341/13 |
| 4,906,992 | 3/1990 | Wingate et al. | 341/9 |
| 4,947,166 | 8/1990 | Wingate et al. | 341/13 |
| 4,959,615 | 9/1990 | Andermo | |
| 4,988,945 | 1/1991 | Nagase | 324/175 |
| 5,023,559 | 6/1991 | Andermo | |
| 5,062,214 | 11/1991 | Gustafsson et al. | 33/706 |
| 5,225,830 | 7/1993 | Andermo et al. | 341/13 |
| 5,287,630 | 2/1994 | Geisler | 33/706 |

FOREIGN PATENT DOCUMENTS 1-187413 7/1989 Japan .
1-212314 8/1989 Japan .

*Primary Examiner*—Robert W. Beausoliel, Jr.
*Assistant Examiner*—Phillip F. Vales
*Attorney, Agent, or Firm*—Oliff & Berridge

[57] ABSTRACT

A data output encoder capable of having its state of retaining internal error information and self-diagnostic information reset without recourse to removing power or furnishing a dedicated signal line. A reset pulse generator monitors the changing status of an externally provided output request signal. When the signal status reaches a predetermined pattern, the reset pulse generator generates reset pulses that cause an RS flip-flop circuit to reset the state in which the internal error information and self-diagnostic information are retained.

17 Claims, 11 Drawing Sheets

FIG. 2
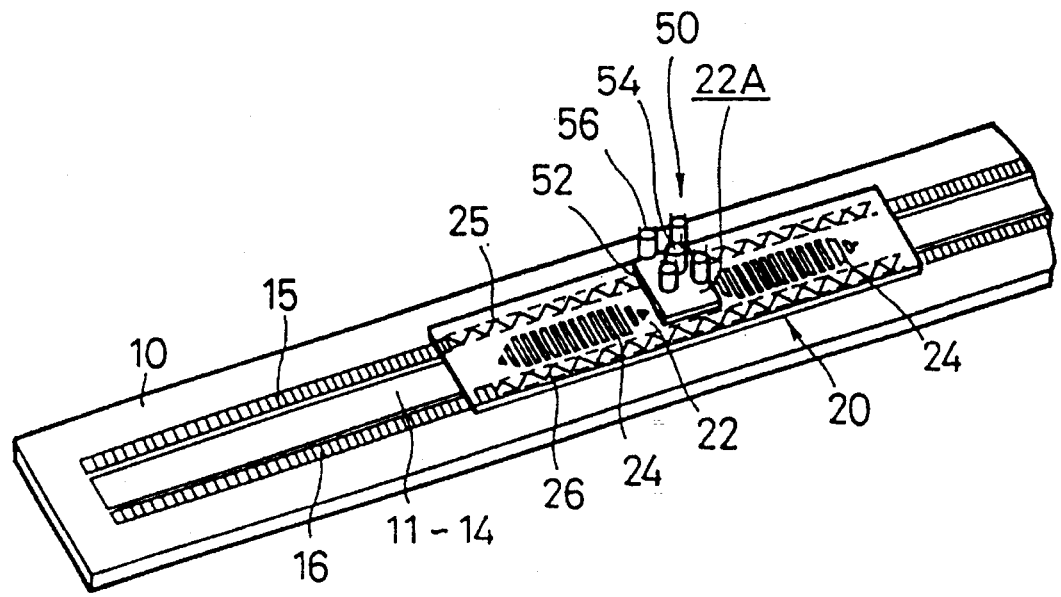
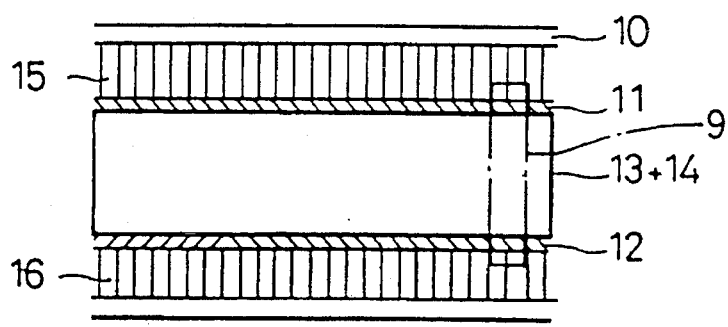
FIG. 3A
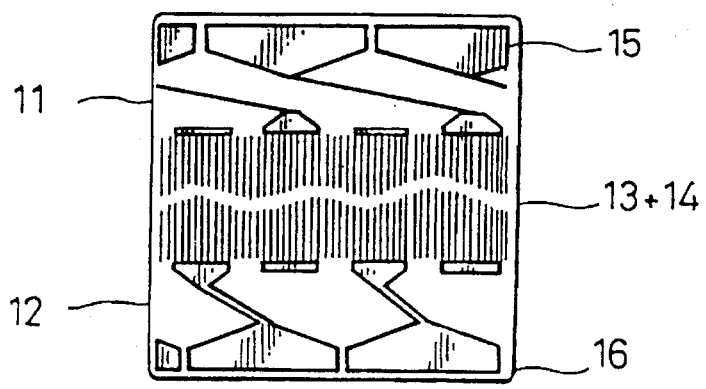
FIG. 3B

FIG. 11
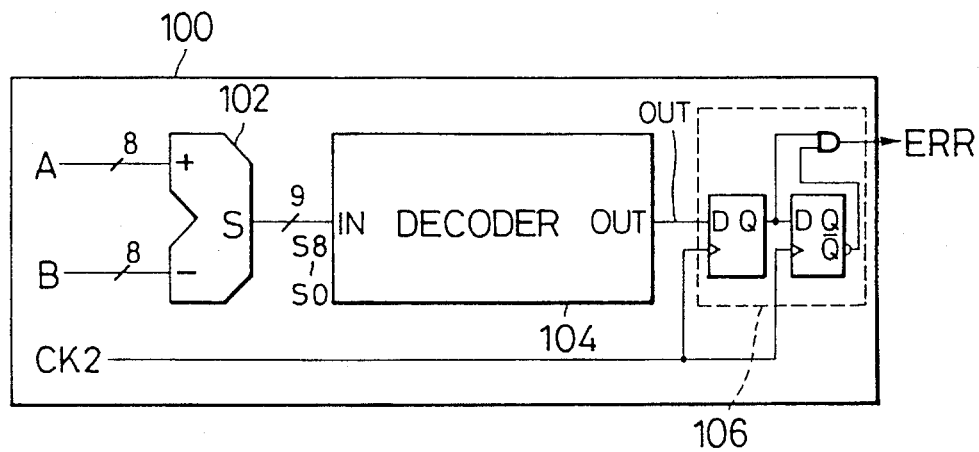
FIG. 12
TRUTH TABLE OF DECODER
| S8 IN S0 | OUT |
|---|---|
| 0 0 0 0 0 0 0 0 1 (+1) | 0 |
| 0 0 0 0 0 0 0 0 0 (0) | 0 |
| 1 1 1 1 1 1 1 1 1 (−1) | 0 |
| EXCEPT ABOVE | 1 |
FIG. 13
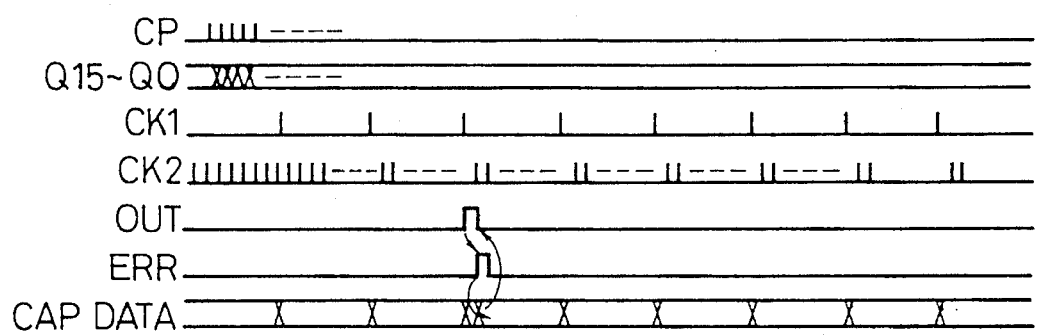

DATA OUTPUT ENCODER HAVING RESETTING MECHANISM

BACKGROUND OF THE INVENTION

1. Field of the Invention

The present invention relates to a data output encoder that outputs detected positions as data to the outside. More particularly, the invention relates to a data output encoder which, after outputting to an external party internal error information and self-diagnostic information being retained inside, allows its information retaining state to be easily reset by the external party in communication with the data output encoder.

2. Description of the Prior Art

Some prior art data output encoders that output detected positions as data to the outside have an additional feature. This is the ability to retain and output to the outside intra-encoder error information and self-diagnostic information. These kinds of information result illustratively from cases where abnormally high speeds of movement on the scale have exceeded the critical responsive levels of detectors.

The reason for retaining the error information and self-diagnostic information is to make sure that the two kinds of information are delivered unfailingly to the outside even if error signals and other data constituting the information occur only temporarily.

Meanwhile, after the error information and self-diagnostic information are transferred to the external party in communication, it is necessary for the encoder to have its information retaining state reset by the other party. The reset operation is needed to make way for more error information and self-diagnostic information to be obtained anew.

So far, the prior art encoder is reset using one of a few conventional measures: by turning off power to the encoder and then applying power again to execute an information resetting sequence every time power is applied; or by furnishing a dedicated reset line for resetting the information retaining state of the encoder.

These conventional resetting measures have their share of disadvantages. For example, when the encoder is turned off and then powered again for resetting, the startup takes time due to a number of self-diagnostic operations being performed by the encoder concurrently. This amounts to an extra time required to reset the information retaining state of the encoder. Furthermore, furnishing a dedicated reset line for resetting the encoder involves greater power dissipation, more space required for installation and higher costs.

SUMMARY OF THE INVENTION

It is therefore an object of the present invention to overcome the above described drawbacks and disadvantages and to provide a data output encoder capable of having its state of retaining internal error information and self-diagnostic information reset easily without the need for turning off power to the encoder or for furnishing a dedicated reset line.

In carrying out the invention and according to one aspect thereof, there is provided a data output encoder for outputting detected positions as data to the outside, the data output encoder comprising: means for retaining internal error information or self-diagnostic information; means for outputting the data in response to an externally furnished output request signal; means for monitoring the changing status of the output request signal; and means for resetting the internal error information or the self-diagnostic information when the changing status of the output request signal reaches a predetermined pattern.

The invention draws on the fact that data output encoders are generally equipped with means fop outputting data in response to an output request signal from the outside. That is, data are output usually when the output request signal reaches a predetermined state. In general, the period in which the output request signal is in the predetermined state is very short.

Given the short period the output request signal is in the predetermined state, the invention includes means for monitoring the changing status of the output request signal and for resetting the state of retaining the internal error information or self-diagnostic information when the changing status of the signal reaches a predetermined pattern.

The above aspect of the invention involves simply adding a circuit arrangement to the encoder so as to readily reset the information retaining state. There is no need for turning off and applying again power to the encoder, or for providing a dedicated reset line to the encoder. In particular, if the predetermined pattern is a state in which the output request signal is being input longer than a predetermined duration of time, that pattern is easy to detect.

The above and other related objects and features of the invention, as well as the novelty thereof, will clearly appear from the following description and from the accompanying drawings.

BRIEF DESCRIPTION OF THE DRAWINGS

The preferred embodiments of the invention will be described with reference to the drawings, wherein like elements have been denoted throughout the figures with like reference numerals, and wherein:

FIG. 2 is a perspective view of a scale and detectors for use with the embodiment of FIG. 1;

FIGS. 3A–3B is a partially enlarged plan view of scale patterns for use with the embodiment;

FIG. 11 is a circuit diagram of the comparison circuit in the embodiment;

FIG. 12 is a truth table of a decoder used by the comparison circuit;

FIG. 13 is a timing chart showing how the comparison circuit works;

DESCRIPTION OF THE PREFERRED EMBODIMENTS

One preferred embodiment of the invention will now be described in detail with reference to the accompanying drawings.

Figure 1:
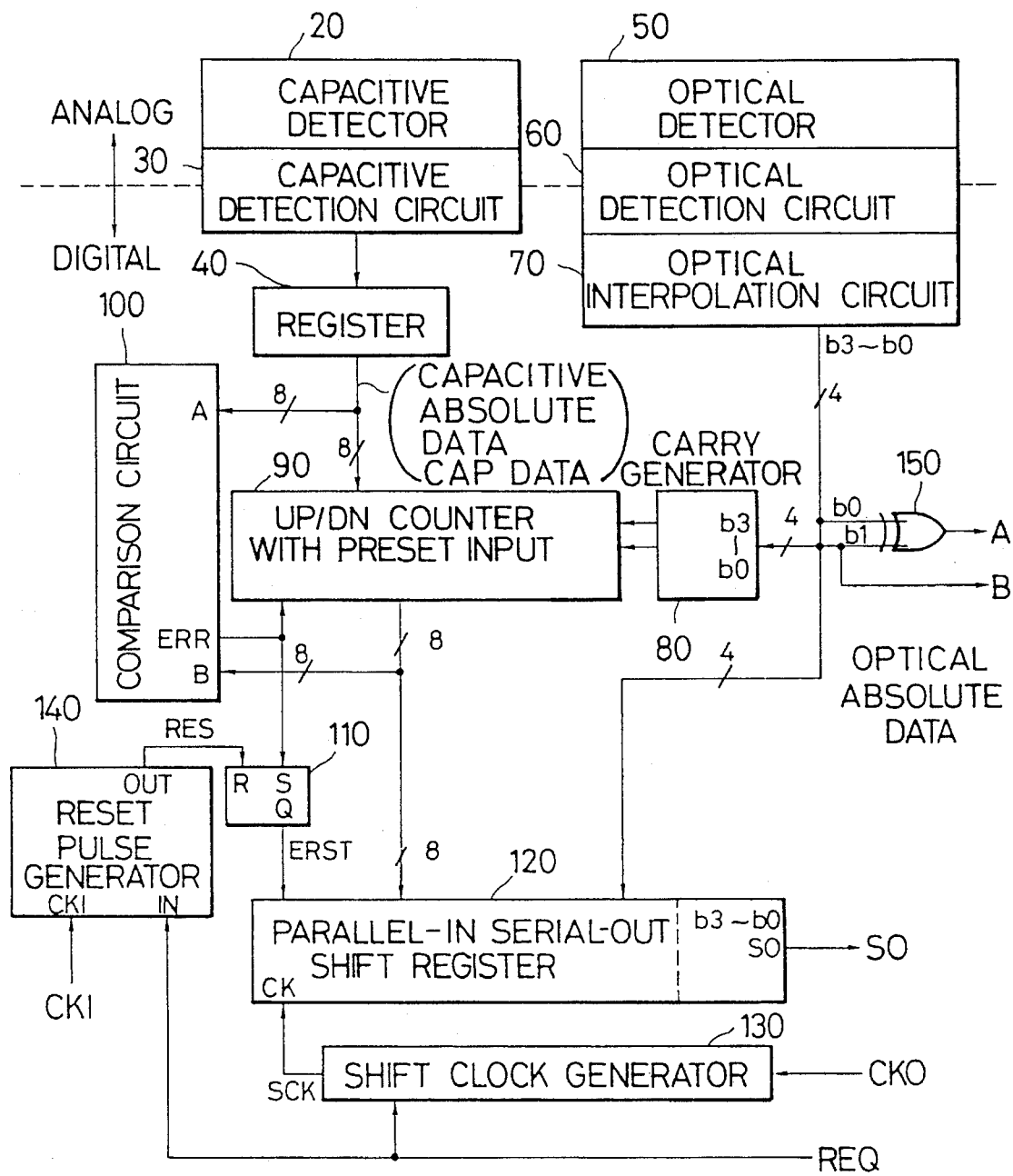
FIG. 1 is a block diagram of an overall construction of a data output encoder embodying the present invention.

FIG. 1 is a block diagram of an overall construction of an absolute encoder embodying the present invention, and FIG. 2 is a perspective view of a scale and detectors used by this embodiment.

The embodiment comprises: a scale 10 having low resolution, long wavelength capacitive absolute code patterns 11–13, 15 and 16 as well as a high resolution, short wavelength optical incremental code pattern 14 formed in the direction of position detection; a capacitive detector 20 that reads at low speeds the above mentioned capacitive absolute code patterns; a capacitive detection circuit 30 that processes the output of the capacitive detector 20 to generate low resolution, long wavelength capacitive absolute signals; a register 40 that puts together the capacitive absolute signals given per track by the capacitive detection circuit 30 on a time division basis so as to create capacitive absolute data CAPDATA (parallel signal); an optical detector 50 that reads the optical incremental code at high speeds; an optical detection circuit 60 that processes the output of the optical detector 50 to generate a high resolution, short wavelength optical incremental signal; an interpolation circuit 70 that interpolates the optical incremental signal to generate high resolution, short wavelength optical absolute signals (parallel signals) b3–b0; a carry generator 80 that generates a carry signal for the least significant digit of the capacitive absolute signals with respect to the most significant digit of the optical absolute signal output from the interpolation circuit 70; a preset input equipped up/down (UP/DN) counter 90 that counts the capacitive absolute signals and the carry signal to generate high-order digits of an output absolute signal (serial signal) SO; a comparison circuit 100 that compares the capacitive absolute signal output from the register 40 with the output from the up/down counter 90 to generate an error signal ERR if the difference therebetween exceeds a predetermined value; an RS flip-flop (F/F) circuit 110 that retains the signal ERR from the comparison circuit 100; a parallel-in serial-out shift register 120 that outputs in serial data SO the output of the up/down counter 90 (parallel signal) as a high-order digit signal and the optical absolute signal as a low-order digit signal; a shift clock generator 130 that generates a shift clock signal SCK in response to a serial data output request signal REQ from the opposite party in communication, thereby driving the shift register 120 to output the serial data SO; a reset pulse generator 140 that generates reset pulses RES to reset the signal retaining state of the RS flip-flop circuit 110 while the output request signal REQ is being sustained longer than a predetermined period; and an exclusive OR gate circuit 150 that generates two phase square wave signals A and B based on the optical absolute signals b0 and b1 from the interpolation circuit 70 for output to the outside.

As detailed in FIG. 3, the scale 10 has in the order of diminishing wavelengths a first track 11 for coarse capacitive measurement, a second track 12 for medium capacitive measurement and a third track 13 for fine capacitive measurement formed on the surface. The third track 13 further includes an optical fourth track (optical main scale) 14 formed by fine divisions in the direction of position detection.

Because the capacitive third track 13 and the optical fourth track 14 physically share the same track, the overall width of the scale 10 is reduced. It is also possible to furnish the capacitive third track and the optical fourth track separately. In FIG. 3, a reference numeral 15 is a group of transfer electrodes for the first track 11, and a reference numeral 16 is a group of transfer electrodes for the second track 12.

As shown in FIG. 2, the capacitive detector 20 comprises a pickup 22 that faces to the main scale 10 and moves in the direction of position detection relative to the main scale 10; transmission (driving) electrodes 24 which are formed on the pickup 22 and to which illustratively eight phase AC signals are applied successively; reception electrodes 25 for the first track 11; and reception electrodes 26 for the second track 12. When signals are received from the third track 13, the reception electrodes 25 and 26 are employed together.

The optical detector 50 is "clasped" structurally by the capacitive detector 20. This arrangement is intended to prevent the detected values of the high-order three capacitive tracks 11 through 13 deviating from the detected values of the lowest-order optical track 14 due to such external disturbances as temperature fluctuation.

Figure 4:
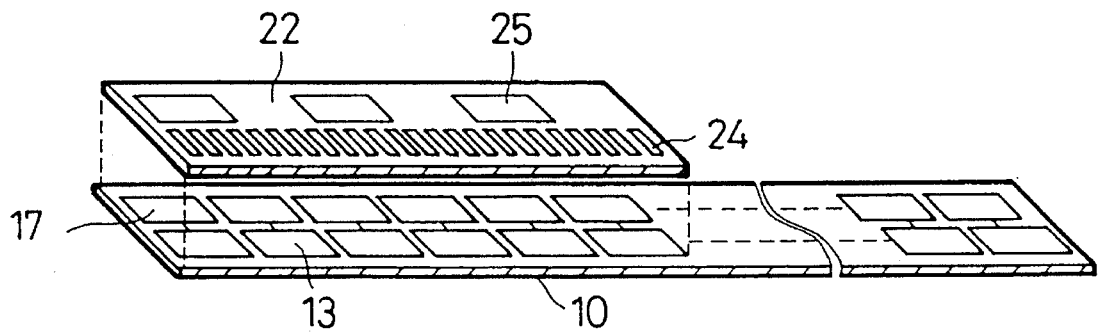
FIG. 4 is a perspective view for depicting how a capacitive detector of the embodiment works.

How the capacitive detector 20 works will now be described briefly. FIG. 4 schematically depicts the electrode pattern of a capacitive absolute detector having a measuring range of a single track (third track 13 in this example) for descriptive simplicity.

This capacitive absolute encoder comprises the scale 10 and the pickup 22 that moves along the scale preserving a constant gap against it. The scale 10 and pickup 22 have their electrodes formed through etching of conduction patterns on an insulator such as a glass plate or glass epoxy plate.

In operation, a voltage applied to the transmission electrodes 24 on the pickup 22 is transferred to the track electrodes 13 through capacitive coupling. The track electrodes 13 on the scale 10 are coupled by wiring to transfer electrodes (e.g., electrodes 15), while the transfer electrodes 17 are capacitively coupled to reception electrodes (e.g., electrodes 25) on the pickup 22. Thus the reception electrodes 25 provide signals depending on capacitance.

The pitch of each of the tracks on the scale 10 differs from that of the transfer electrodes 17. It follows that the inclination of the interconnecting wires varies depending on the position on the scale 10. The transmission electrodes 24 are composed illustratively of electrodes interconnected in groups of eight. Electrical connections between the electrodes 24 may be selected as desired using a circuit board. The pitch of the reception electrodes 25 is made equal to one group of transmission electrodes 24. The length of detecting direction of the reception electrodes 25 is made the same as half the wavelength of the transmission electrodes 24 (i.e., worth 4 electrodes).

Suppose that the pickup 22 is fixedly positioned relative to the scale 10, with eight interconnections between the transmission electrodes 24 successively changed between first and fourth, between second and fifth, between third and sixth, and so on. In each of the changed interconnections, measurements are taken of the capacitance between transmission electrode 24 and reception electrode 25. In such cases, the capacitance measured corresponds to each of the points 45 degrees out of phase with one another along a single period sine wave. If the pickup 22 is moved relative to the scale 10 for specific interconnections selected, the capacitance values measured are seen moving along the same sine wave in keeping with the movement of the pickup 22. This is the operating principle of the capacitive encoder in detecting operation. The direction of the pickup movement is determined by ascertaining the direction of phase change through varied combinations of the transmission electrodes 24.

Figure 5:
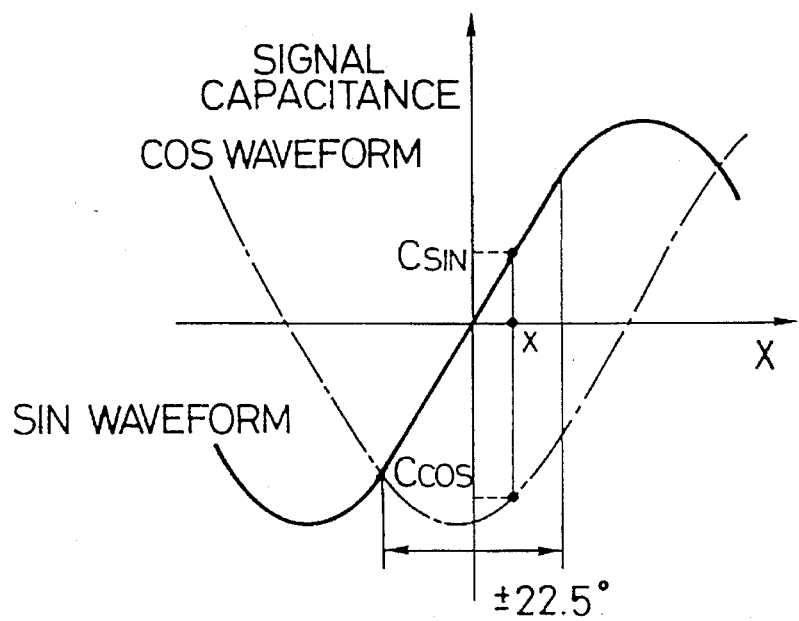
FIG. 5 is a diagrammatic view of output waveforms of the capacitive detector.

Changing the interconnections of the transmission electrodes provides a sine capacitance waveform (SIN) and cosine capacitance waveform (COS) shown in FIG. 5. Given these waveforms, the capacitive detection circuit 30 performs the operation $$\tan^{-1}(\sin X/\cos X)$$

to find the value of a position X (FIG. 5). Detailed constructions and operations of the capacitive detector are contained in U.S. Pat. No. 4,959,615 and U.S. Ser. No. 07/372,773, and will not be repeated hereunder.

Figure 6:
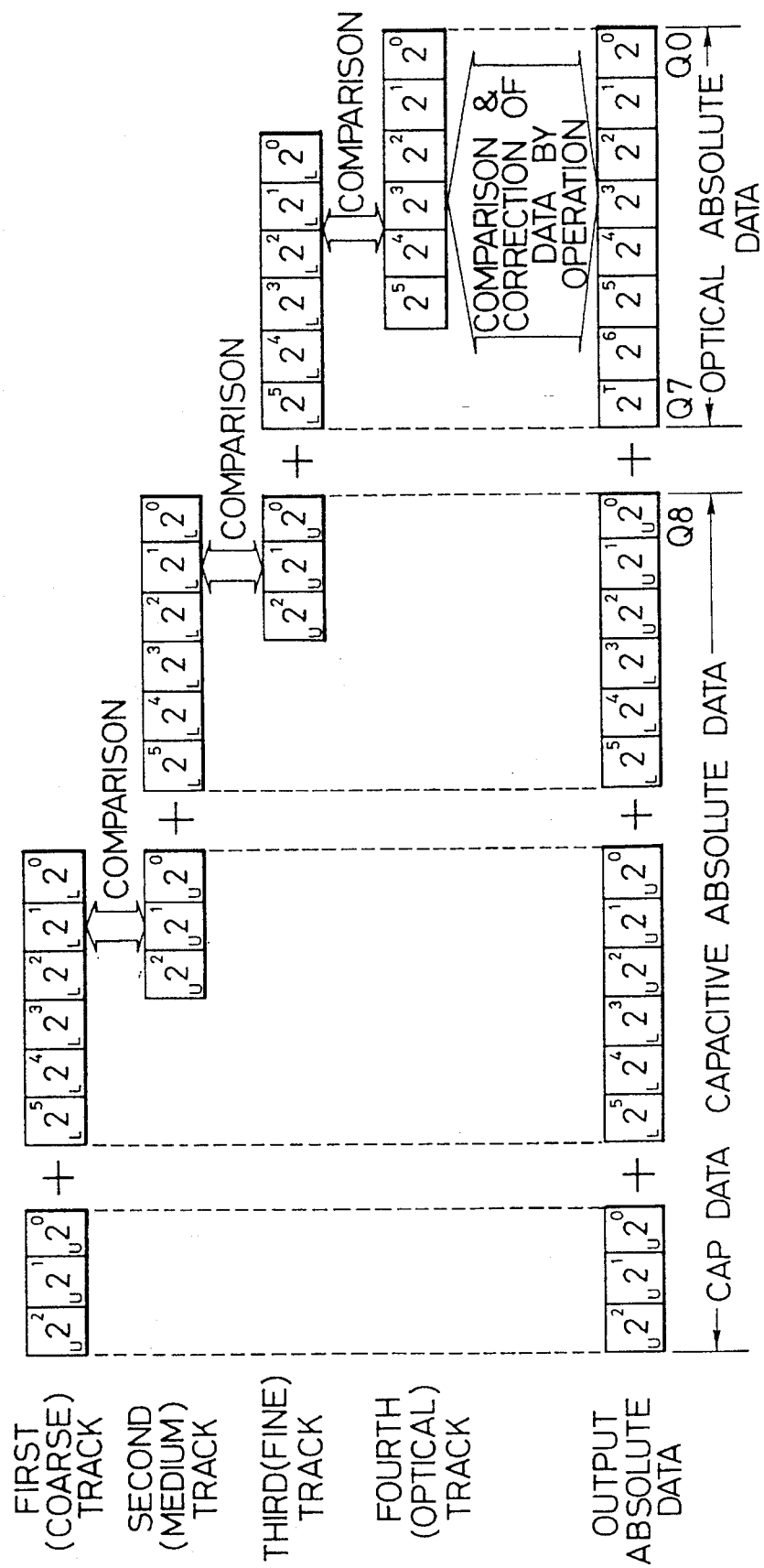
FIG. 6 is a diagrammatic view of a data structure for describing how a register and a comparison circuit of the embodiment work.

The register 40 has a function of combining signals from three tracks of the capacitive detector 20 into a single output. Specifically, the data obtained by the capacitive detection circuit 30 from the three high-order tracks have three bit overlaps between them, as shown in FIG. 6. These are redundant bit overlaps intended to prevent a track error and a quantization error of each track from erroneously designating a low-order track. The register 40 receives trackwise data on a time division basis, verifies that the overlapping bits of the data fall within a predetermined difference, and combines the data for output following verification.

If the overlapping data are out of tolerance, low-order data may illustratively be taken as correct data. In such cases, if the overlapping data difference is greater than a predetermined value, an abnormal state may be recognized and an error signal may be generated accordingly.

Figure 7:
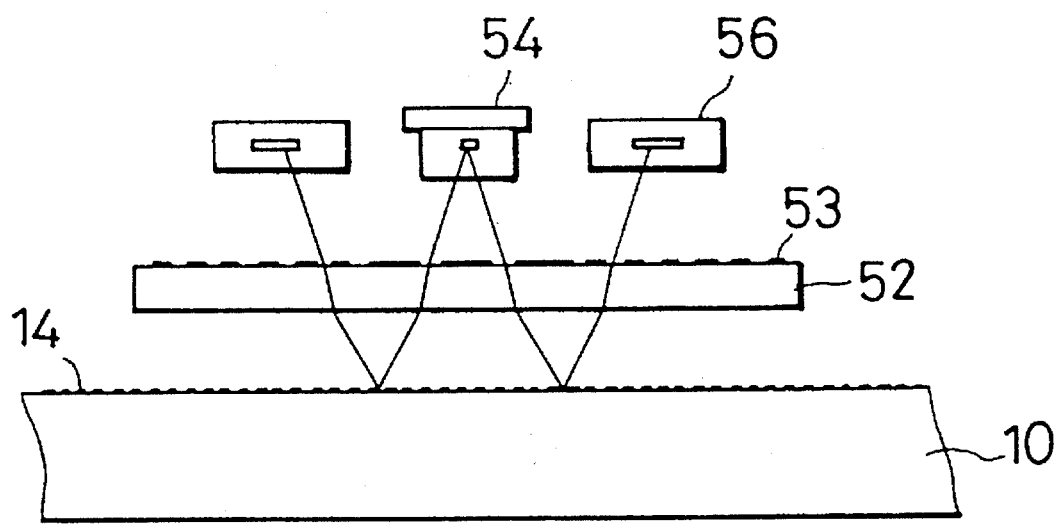
FIG. 7 is a longitudinal sectional view of an optical detector for use with the embodiment.

As shown in FIG. 7 in detail, the optical detector 50 comprises: a slit plate 52 that moves integrally with the pickup 22 of the capacitive detector; a light emitting diode 54 which has characteristics close to those of a point light source and which emits diffused light to the fourth track 14 (common to third track 13) on the scale 10 through an opening 22A (see FIG. 2) at the center of the pickup 22; and four phototransistors 56 for receiving light beams which are 90 degrees out of phase with one another after reflection on the surface of the scale 10 or the fourth track 14 and which are modulated by four index scales 53 on the slit plate 52.

In this setup, one light source and four light receiving elements provide sine waveforms of different phases. These are sine waveforms of stable pitches, highly immune to temperature fluctuation or to the gap variation between slit plate 52 and scale 10.

Detailed constructions and operations of the optical detector 50 and of the optical detection circuit 60 that processes the detector output to generate two phase sine wave signals 90 degrees out of phase with each other are omitted hereunder; these details are disclosed in Japanese Patent Laid Open No. 187413/1989 and other publications.

Likewise, detailed constructions and operations of the interpolation circuit 70 mentioned above are included in Japanese Patent Laid Open No. 212314/1989, and will not be repeated hereunder.

Figure 8:
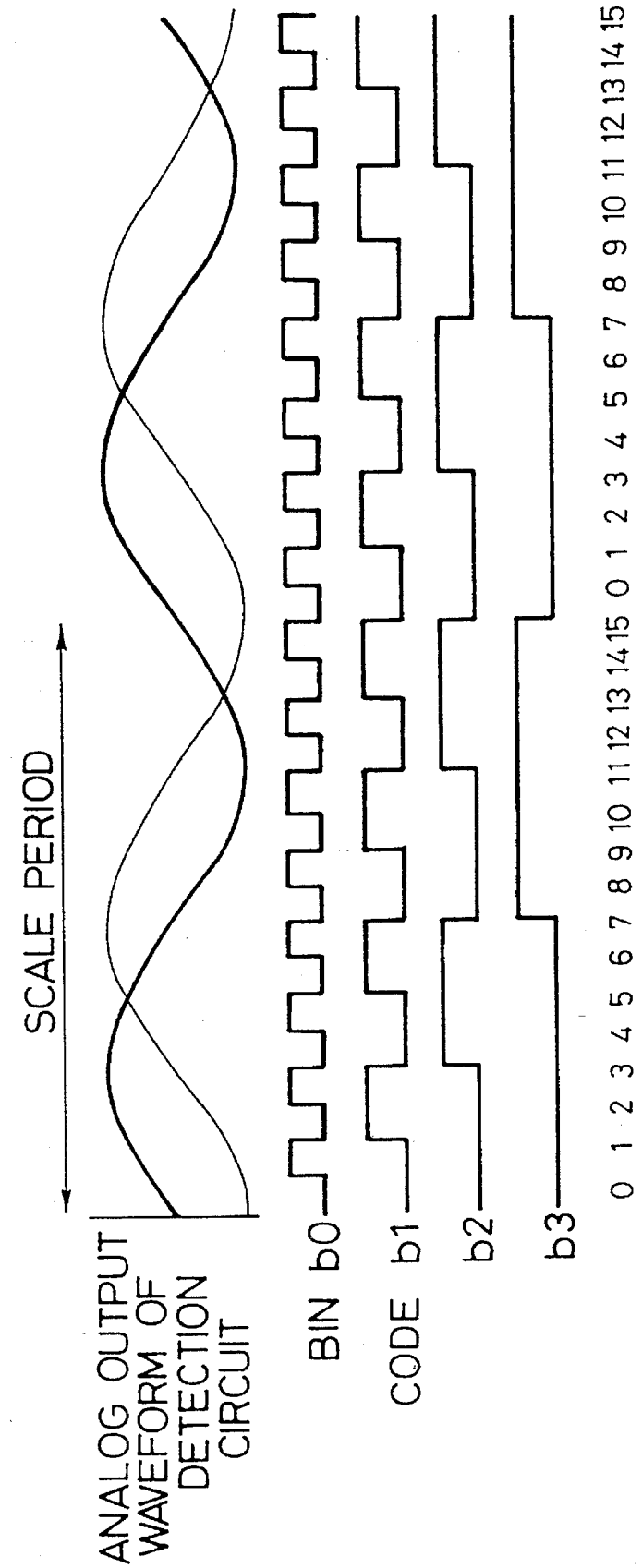
FIG. 8 is a timing chart showing waveforms of the output from an optical detection circuit of the embodiment in comparison with the binary coded signal output from an interpolation circuit of the embodiment.

From two phase square wave signals 90 degrees out of phase with each another illustratively shown in the upper part of FIG. 8, the interpolation circuit 70 obtains binary coded (BIN) signals b0–b3 in the lower part of the figure. More specifically, the two phase square wave signals are formed by the optical detection circuit 60 as analog output waveforms. The interpolation circuit 70 then divides the two phase square wave signals through resistance potential division into the binary coded signals b3–b0. The signals b3–b0 are input to the carry generator 80.

Figure 9:
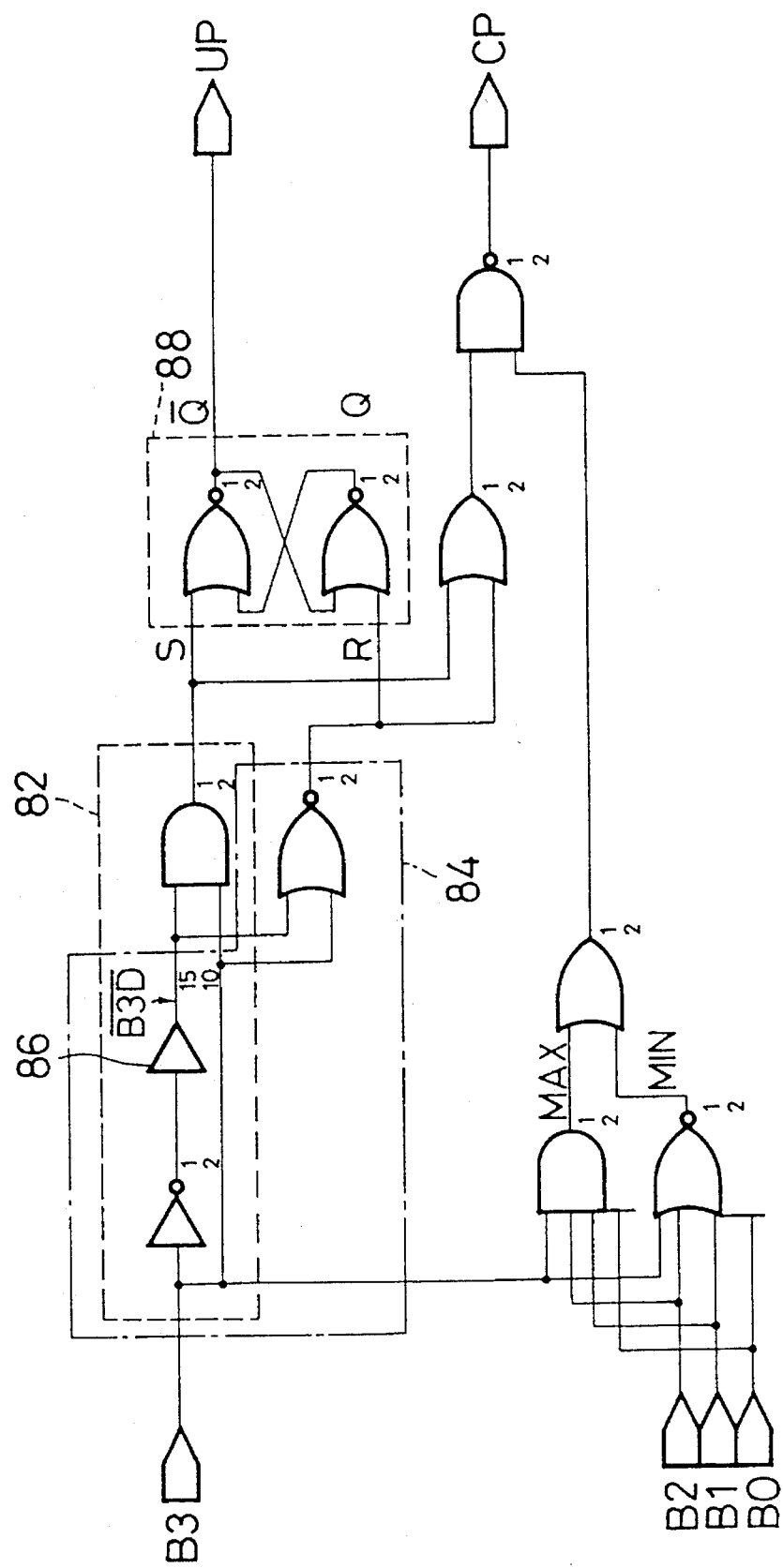
FIG. 9 is a circuit diagram of a typical carry generator for use with the embodiment.
Figure 10:
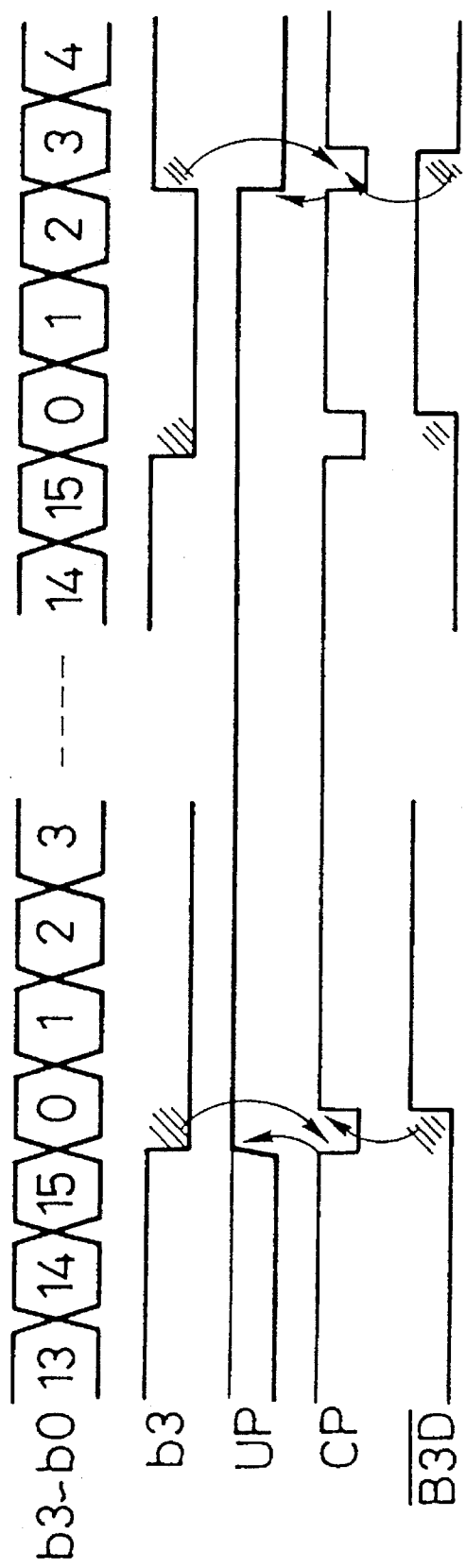
FIG. 10 is a timing chart illustrating how the carry generator works.

The carry generator 80 is illustratively structured as shown in FIG. 9. It includes a leading edge detection circuit 82 and a trailing edge detection circuit 84, the two circuits sharing a common delay element 86. In operation, as depicted in the timing chart of FIG. 10, the carry generator 80 has the circuits 82 and 84 observe edges of the highest-order digit signal b3 to output a direction determining signal UP and a count pulse signal CP via an RS flip-flop circuit 88 or the like.

Count pulses generated by the carry generator 80 are input to the up/down counter 90. The up/down counter 90 produces data having a number of digits exceeding those of the absolute data generated by the optical detection circuit 60. The data having these digits are compared for correction with those generated by the register 40 of the capacitive detection section, as shown in FIG. 6.

Illustratively, the comparison circuit 100 of FIG. 11 compares the value of the register 40 (input A) with that of the counter 90 (input B). Specifically, the inputs A and B are entered into an adder (subtracter) 102. The result of this operation is judged by a decoder 104.

FIG. 12 is a typical truth table for use with the decoder 104. This truth table is designed so that if the difference involved is greater than +or −2, the leading edge detection circuit 106 generates an error signal (ERR). The error signal ERR presets the counter 90 and loads data once again.

The leading edge detection circuit 106 is made of two D type flip-flop circuits and an AND gate circuit downstream of the decoder 104. The circuit 106 detects generation of the error signal ERR (LD signal) that is input to the counter 90, and converts the signal into a pulse signal having an appropriate width (matching the period of clock signal CK2).

FIG. 13 is a timing chart showing how the comparison circuit 100 works. Where the value of the counter 90 deviates from the capacitive absolute data coming from the capacitive detector detecting high-order absolute data, the comparison circuit 100 generates an error signal ERR and, in this embodiment, automatically updates the counter value using the correct absolute data. The function of the comparison circuit 100 may also be implemented by use of a microcomputer operating on suitable software.

Figure 14:
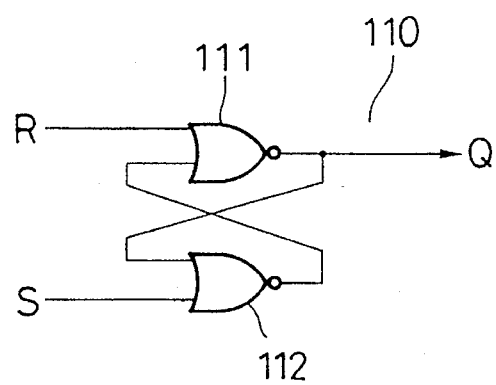
FIG. 14 is a circuit diagram of an RS flip-flop circuit for use with the embodiment.

The RS flip-flop circuit 110 is constituted illustratively by two NOR gate circuits 111 and 112, as shown in FIG. 14. When the comparison circuit 100 generates an error signal ERR, the RS flip-flop circuit 110 retains the state of the error signal. When reset pulses RES are received from the reset pulse generator 140, the RS flip-flop circuit 110 resets the state of error signal (ERR) retention.

The reason for the RS flip-flop circuit 110 to retain the state of the error signal ERR is to make sure that even if generation of the error signal is temporary upon incremental output of the low-order two bits in detected absolute data as signals A and B, the error signal is retained unfailingly and the related error information is output in the serial data SO. In this manner, the opposite party in communication with the encoder is able to know the occurrence of abnormal incremental data regardless of the short duration of error signal generation. The output ERST of the RS flip-flop circuit 110 that retains the temporarily generated error signal ERR is placed in the shift register 120. Illustratively, the first bit in the serial data SO indicates the error state.

Figure 15:
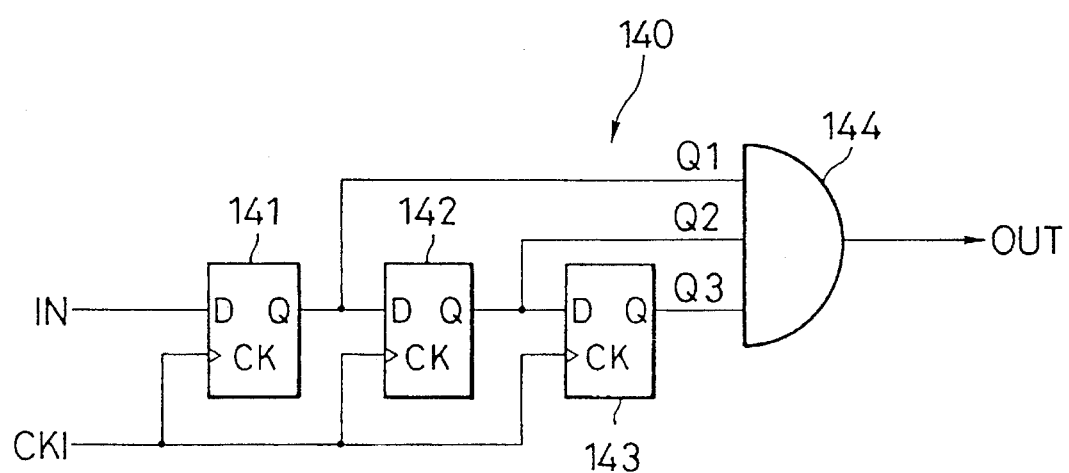
FIG. 15 is a circuit diagram of a reset pulse generator for use with the embodiment.

As shown in FIG. 15, the reset pulse generator 140 illustratively comprises three D type flip-flop circuits 141, 142 and 143; and an AND gate circuit 144 that logically multiplies outputs Q1, Q2 and Q3 coming respectively from the circuits 141, 142 and 143. When the high level of an input signal IN (i.e., output request signal REQ) to the reset pulse generator 140 lasts longer than, say, three periods of the clock signal CK1 (3×Tck1), the outputs Q1, Q2 and Q3 of the D type flip-flop circuits 141, 142 and 143 are all brought High and the output of the AND gate circuit 144 goes High. This causes the reset pulse generator 140 to generate reset pulses RES that bring the output ERST of the RS flip-flop circuit 110 Low, thereby resetting the error retaining state.

Figure 16:
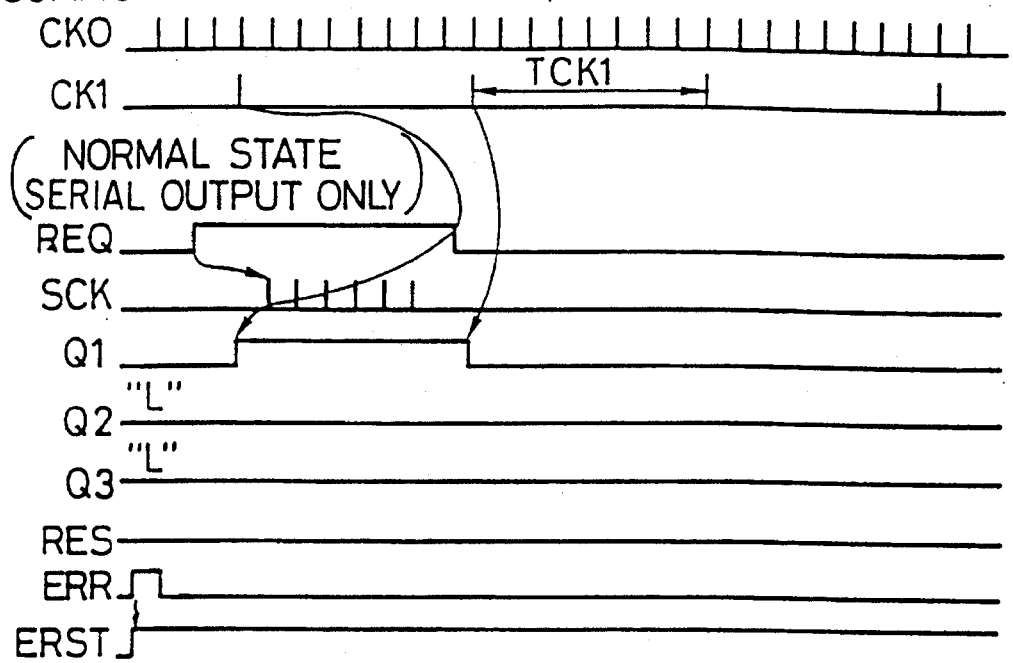
FIG. 16 is a timing chart depicting typical signal waveforms of various parts of the embodiment in the normal output state.

The shift register 120 converts parallel data signals to serial data signals, and transfers serially the serial data SO to the opposite party in communication (externally located). In normal state, as depicted in FIG. 16, an output request signal REQ being brought High indicates that the opposite party has made a request for data. Following the reception of the REQ signal, a predetermined time elapses until the opposite party is ready to receive data. After that, the shift clock generator 130 supplies the shift register 120 with a shift clock signal SCK. This causes the shift register 120 to output serially the serial data SO. At this point, the number of clock pulses given by the shift clock generator 130 to the shift register 120 is n-1, where n is the number of bits of all data.

In normal state, the data request signal REQ from the opposite party in communication remains High usually for about a single period (Tck1) of the clock signal CK1. This period is shorter than the time (3×Tck1) required for all outputs Q1, Q2 and Q3 of the D type flip-flop circuits 141, 142 and 143 in the reset pulse generator 140 to go High. Thus reset pulses RES are not generated. If an error signal ERR occurs, the error signal state is retained by the RS flip-flop circuit 110.

The opposite party in communication can receive the error signal and absolute data concurrently by bringing its output request signal REQ High.

Figure 17:
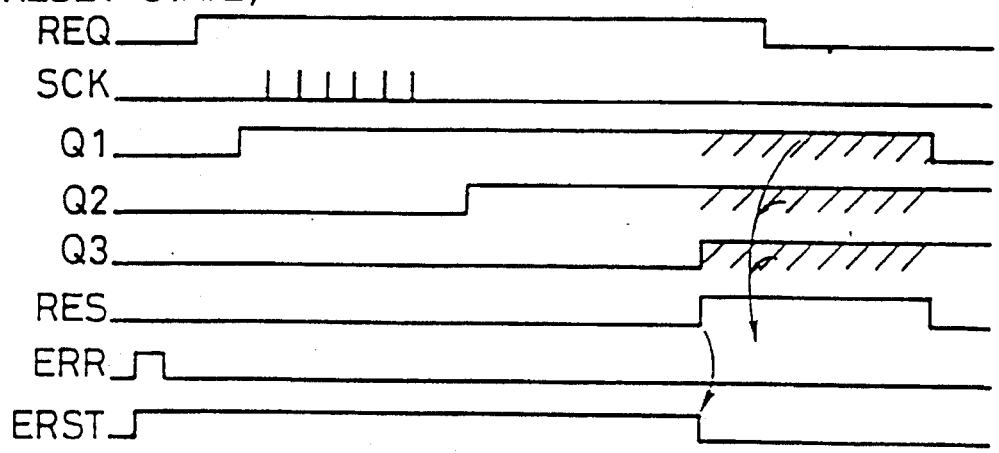
FIG. 17 is a timing chart illustrating typical signal waveforms of various parts of the embodiment in the reset state.

If the error signal is a logical 1 indicating that an error has occurred, the output request signal REQ is kept High longer than three clock periods (3×Tck1), as shown in FIG. 17. Alternatively, the signal REQ may be brought Low and then brought High again for at least three periods (3×Tck1). This turns on the output of the reset pulse generator 140 that inputs reset pulses RES to the RS flip-flop circuit 110. That in turn resets the error signal retaining state output ERST of the RS flip-flop circuit 110.

With this embodiment, an error reset request is recognized when the REQ signal is found to be High longer than a predetermined period of time. This makes it easy to determine the presence of the error reset request.

The above scheme of recognizing an error reset request based on an output request signal REQ is not limitative of the invention. An alternative to this scheme is to reset the error signal retaining state only when a specific signal level pattern is given to the output request signal REQ. In that case, the AND gate circuit of the reset pulse generator 140 may be replaced with a decoder that addresses the signal level pattern.

With this embodiment, the reset pulse generator 140 comprises the D type flip-flop circuits 141, 142 and 143. This setup is equivalent to the construction of a simple digital filter using D type flip-flop circuits. If the period of the clock signal CK1 is shortened and the number of D type flip-flop circuits is increased, the resistance to noises in the output request signal REQ will be enhanced.

Although the embodiment above is an absolute encoder that combines a low resolution, long wavelength capacitive detector with a high resolution, short wavelength optical incremental detector, this application is not limitative of the invention. Alternatively, the invention may also be applied to absolute or incremental decoders of the types other than the capacitive or optical type. Furthermore, the category of encoders is not limited to the linear encoder category; rotary encoders may also be used with the invention. The type of output data is not limited to serial data. That is, the invention may also be applied to encoders that output incremental data or other data on request.

As many apparently different embodiments of this invention may be made without departing from the spirit and scope thereof, it is to be understood that the invention is not limited to the specific embodiments thereof except as defined in the appended claims.

It is further understood by those skilled in the art that the foregoing description is a preferred embodiment of the disclosed device and that various changes and modifications may be made in the invention without departing from the spirit and scope thereof.

What is claimed:

1. A data output encoder for outputting detected positions as data, said data output encoder comprising:

means for retaining encoder internal error information or encoder self-diagnostic information;

means for outputting said data in response to an externally furnished output request signal;

means for monitoring a changing status of said output request signal; and means for resetting said encoder internal error information or said encoder self-diagnostic information when said changing status of said output request signal reaches a predetermined pattern, wherein said means for resetting said encoder internal error information or said encoder self-diagnostic information is a reset pulse generator generating reset pulses when said output request signal reaches said predetermined pattern, said reset pulses resetting said encoder internal error information or said encoder self-diagnostic information.

2. A data output encoder according to claim 1, wherein said predetermined pattern occurs when said output request signal remains input to said data encoder for at least a predetermined period of time.

3. A data output encoder according to claim 1, wherein said encoder internal error information is generated when a difference between a capacitive absolute signal and an optical absolute signal generated by said encoder is greater than a predetermined value.

4. A data output encoder according to claim 1, wherein said means for retaining said encoder internal error information or said encoder self-diagnostic information is an RS flip-flop circuit arrangement.

5. A data output encoder according to claim 3, wherein said means for outputting said data includes:

a shift clock generator for generating a shift clock signal in response to said externally furnished output request signal; and a shift register driven by said shift clock signal for outputting data containing a high order digit signal and a low-order digit signal, said high-order digit signal including said capacitive absolute signal, said low-order digit signal including said optical absolute signal.

6. A data output encoder according to claim 5, wherein said shift register stores the output of an RS flip-flop circuit arrangement retaining said encoder internal error information or said encoder self-diagnostic information.

7. A data output encoder according to claim 1, wherein said reset pulse generator includes:

a plurality of D flip-flop circuits connected in cascade fashion for receiving said output request signal; and a decoder for generating said reset pulses when all outputs of said D flip-flop circuits reach a signal level commensurate with said predetermined pattern.

8. A data output encoder according to claim 2, wherein said decoder is an AND gate circuit generating said reset pulses when all outputs of said D flip-flop circuits reach a high level.

9. A data output encoder according to claim 1, wherein the output data contain said encoder internal error information or said encoder self-diagnostic information.

10. A data output encoder for outputting detected positions as data, said data output encoder comprising:

means for retaining encoder internal error information or encoder self-diagnostic information, wherein said encoder internal error information is generated when a difference between a capacitive absolute signal and an optical absolute signal generated by said encoder is greater than a predetermined value;

means for outputting said data in response to an externally furnished output request signal;

means for monitoring a changing status of said output request signal; and means for resetting said encoder internal error information or said encoder self-diagnostic information when said changing status of said output request signal reaches a predetermined pattern, wherein said means for outputting said data includes:

a shift clock generator for generating a shift clock signal in response to said externally furnished output request signal; and a shift register driven by said shift clock signal for outputting data containing a high order digit signal and a low-order digit signal, said high-order digit signal including said capacitive absolute signal, said low-order digit signal including said optical absolute signal.

11. A data output encoder according to claim 10, wherein said predetermined pattern occurs when said output request signal remains input to said data encoder for at least a predetermined period of time.

12. A data output encoder according to claim 10, wherein said means for retaining said encoder internal error information or said encoder self-diagnostic information is an RS flip-flop circuit arrangement.

13. A data output encoder according to claim 10, wherein said shift register stores the output of an RS flip-flop circuit arrangement retaining said encoder internal error information or said encoder self-diagnostic information.

14. A data output encoder according to claim 10, wherein said means for resetting said encoder internal error information or said encoder self-diagnostic information is a reset pulse generator generating reset pulses when said output request signal reaches said predetermined pattern, said reset pulses resetting said encoder internal error information or said encoder self-diagnostic information.

15. A data output encoder according to claim 14, wherein said reset pulse generator includes:

a plurality of D flip-flop circuits connected in cascade fashion for receiving said output request signal; and a decoder for generating said reset pulses when all outputs of said D flip-flop circuits reach a signal level commensurate with said predetermined pattern.

16. A data output encoder according to claim 15, wherein said decoder is an AND gate circuit generating said reset pulses when all outputs of said D flip-flop circuits reach a high level.

17. A data output encoder according to claim 10, wherein the output data contain said encoder internal error information or said encoder self-diagnostic information.

* * * * *